THERMOELECTRIC REFRIGERATOR

Filed Nov. 16, 1960

INVENTOR
G. E. SMITH
BY
Arthur J. Torsiglieri
ATTORNEY

1

3,136,134

THERMOELECTRIC REFRIGERATOR

George E. Smith, Berkeley Heights, N.J., assignor to Bell Telephone Laboratories, Incorporated, New York, N.Y., a corporation of New York Filed Nov. 16, 1960, Ser. No. 69,743
1 Claim. (Cl. 62—3)

This invention relates to refrigerating apparatus and more particularly to such apparatus which utilizes thermoelectric couples as the cooling elements.

The use of thermoelectric couples for cooling by means of the Peltier effect is well known. Cooling in this fashion has many advantages, including compactness and a theoretically infinite life.

One of the limitations on the usefulness of presently available thermoelectric refrigerators is the difficulty in achieving low temperatures, i.e., temperatures much below freezing. This difficulty has arisen primarily because of the past unavailability of thermoelectric materials efficient at low temperatures.

However, for some of the most promising applications of a thermoelectric refrigerator, such as the localized cooling of the semiconductive diode in a parametric amplifier for an improved signal-to-noise figure, it is advantageous to cool to temperatures as low as −100 degrees centigrade.

Accordingly, a specific object of the invention is a thermoelectric refrigerator of improved efficiency for cooling to low temperatures.

A broader object of the invention is a thermoelectric material efficient at low temperatures.

The invention is based on my discovery that alloys of at least several atomic percent antimony and the remainder essentially all bismuth have high thermoelectric figures of merit at low temperatures. Accordingly, these alloys make feasible thermoelectrical refrigeration to −100 degrees centigrade and below. Moreover, the preferred embodiment involves use of a single crystal utilized to develop the thermoelectric effect along the trigonal axis.

Generally, it will be desirable to utilize a thermopile including a plurality of stages to cool from room temperature to temperatures as low as −100 degrees centigrade. The novel thermoelectric materials can be used either in all of the stages or only in the later stages operating below room temperatures where their use is especially efficacious.

Figure 1:
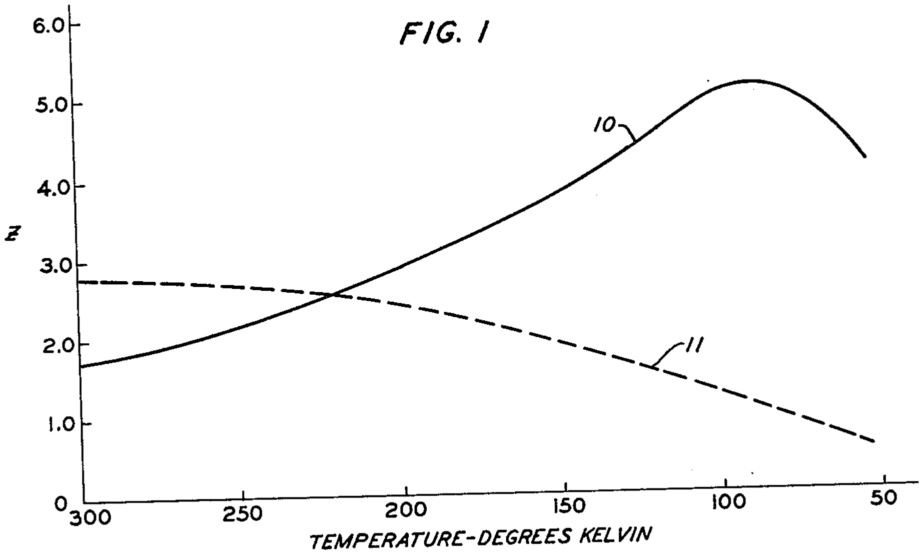
Figure 2:
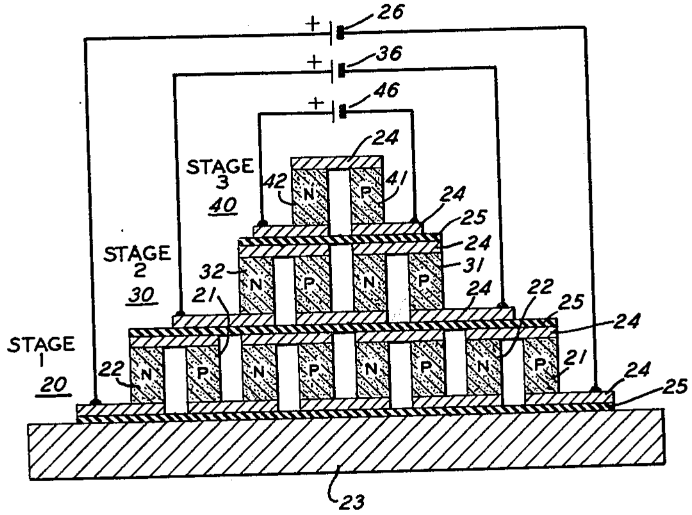

The invention will be better understood from the following more detailed description, taken in conjunction with the accompanying drawings, in which:

FIG. 1 is a plot with temperature of the thermoelectric figures of merit of a representative n-type bismuth-antimony alloy useful as a thermoelectric material in accordance with the invention and of an n-type bismuth-telluride alloy representative of the best prior art thermoelectric materials; and FIG. 2 shows schematically a three-stage thermopile of the kind in which thermoelements in accordance with the invention typically can be used.

With reference now to the drawing, in the plot of FIG. 1 the thermoelectric figure of merit Z measured along the trigonal axis of a single crystal consisting essentially of five atomic percent antimony and 95 atomic percent bismuth is shown by the solid line 10.

The figure of merit Z is defined as $$\frac{\alpha^2\sigma}{K}$$

where $\alpha$ is the thermoelectric power of the material, $\sigma$ is the specific electrical conductivity of the material, and K is the specific thermal conductivity of the material.

2

This definition follows that proposed by Ioffe in his book entitled, "Thermoelements and Thermoelectric Cooling," published by Infosearch Ltd., London (1957).

The broken line 11 is a plot of the figure of merit for an alloy consisting essentially of about ten atomic percent $Bi_2Se_3$, a quarter of an atomic percent CuBr and the remainder $Bi_2Te_3$. As is evident from the graph, while bismuth-antimony alloy is somewhat inferior at temperatures above 225 degrees Kelvin, below such temperatures it is superior, the superiority widening with decreasing temperature to at least about 80 degrees Kelvin. Inasmuch as the bismuth-telluride alloy is typical of the best prior art thermoelectric materials available for use at room temperature and below, it is clear that the bismuth-antimony alloy described is superior to prior art materials below 225 degrees Kelvin.

The specific crossover point is dependent on the antimony concentration in the bismuth-antimony alloy. Alloys with advantageous low temperature properties can include as little as three percent antimony and as much as forty percent. Factors important in the choice of a particular alloy include the temperature to be used as the hot junction of the couple and the temperature desired at the cold junction of the couple.

A single crystal of desired composition can be readily prepared by zone leveling techniques well known in the crystal growing art. In particular, appropriate amounts of bismuth and antimony can be combined in a quartz crucible and a single crystal grown therefrom by passing a molten zone through the mixture. It is desirable to utilize as starting materials, the 99.9999 percent pure bismuth and antimony now commercially available. In one specific example, five grams of high purity antimony were combined with 161 grams of high purity bismuth and a single crystal was grown therefrom by the zone leveling technique.

The use of a single crystal is advantageous because the thermoelectric power of the novel compositions exhibits a maximum along the trigonal axis. However, useful effects are possible with polycrystalline material.

FIG. 2 is illustrative of a thermopile in accordance with the invention. As shown, the first stage 20 comprises four couples connected serially electrically and in parallel thermally, each couple including a p-type arm 21 and an n-type arm 22. Each couple of this stage is operated with its hot junction at room temperature and is designed to provide a temperature of about 240 degrees Kelvin at its cold junctions. For this purpose, it is slightly advantageous to employ in the n-type arm of each couple the bismuth-telluride alloy whose figure of merit is plotted in FIG. 1 in preference to the novel bismuth-antimony alloy. However, the difference is sufficiently small that if uniformity of stages is deemed important the n-type arm can be of the novel alloy. The p-type arms advantageously are all of a known composition consisting of $Bi_2Te_3$ doped with about one atomic percent excess bismuth. A copper bar 23 serves as the heat sink to which the hot junctions of all the couplers of the first stage are thermally connected. Copper foils 24 are used to interconnect the respective arms of each couple and electrically to connect serially the couples of each stage. Thin films 25 of a material such as mica, which is an electrical insulator with good thermal conduction properties, serve to isolate electrically but not thermally successive stages from one another and the first stage additionally from the heat sink.

As shown the second stage 30 comprises a pair of couples. This stage is operated with the hot junction of each couple at the temperature of the cold junctions of the couples of the first stage, i.e., about 240 degrees Kelvin, and serves to provide a temperature of about 200 degrees Kelvin at the cold junction of its couples. To this end, each of the p-type arms 31 is of the known bismuth-doped bismuth telluride used in the first stage and each of the two n-type arms 32 is advantageously of the novel bismuth-antimony alloy.

As shown, the third stage 40 includes only a single couple and is operated with its hot junction at the temperature of the cold junctions of the second stage, i.e., about 200 degrees Kelvin. Such third stage serves to provide a cold junction of about 170 degrees Kelvin. The p-type arm 41 of this couple is also of bismuth-doped bismuth telluride and the n-type arm 42 is of the novel bismuth-antimony alloy. The useful load (not shown) is thermally connected to the cold junction of this last stage. Typically, such load can be a gallium-arsenide diode operating as a parametric amplifier.

In the manner characteristic of thermoelectric refrigerators, it is necessary to provide a current flow through each couple for achieving the desired temperature difference between its two junctions. To this end, separate voltage sources 26, 36 and 46 are provided for the first, second and third stages, respectively. The voltage sources are appropriately poled to provide a temperature difference of appropriate sign between the two junctions of each couple in the usual fashion. For the embodiment described, the voltages applied typically would be about .08 volt per couple for the first stage, .06 volt per couple for the second stage, and .05 volt per couple for the third stage. Typically, the voltage sources should provide between five and ten amperes of current flow through each couple. The mass of each stage would be dependent on the mass of material to be cooled by it, the mass of cooling material being generally at least as large as the mass of the material to be cooled and preferably at least twice. This accounts for the progressively smaller mass, depicted in the drawing by fewer couples, of each succeeding stage of the thermopile. While in the drawing, a succeeding stage is shown as having half the number of couplers of its preceding stage, preferably the fraction should be one quarter. Typically, each arm can be a rod about eight millimeters long and three millimeters square in cross section.

As previously discussed, the principles of the invention are applicable to a range of bismuth-antimony compositions including at least three percent to as much as 40 atomic percent antimony. Moreover, although it presently appears preferable to minimize the presence of other elements when the alloy is to be used as n-type material, the presence of small amounts, such as a fraction of an atomic percent of other elements, such as tellurium or polonium, can be used to affect the thermoelectric properties advantageously for specific applications. Moreover, for use of the alloy as p-type material, it becomes necessary to add small amounts, typically less than one percent, of appropriate p-type doping impurity, such as lead or tin.

It should also be evident that a thermoelement of the novel alloy can be used as one arm of a couple in combination with a thermoelement of any other suitable material as the other arm of the couple. Moreover, it should similarly be evident that a couple including a thermoelement of the novel alloy can be used independently of the manner in which its hot junction is cooled to provide operation in the range where such alloy is particularly efficacious.

Accordingly, it is to be understood that the specific embodiment described is merely illustrative of the general principles of the invention.

What is claimed is:

A method for obtaining low temperature refrigeration comprising passing an electric current through a thermoelectric device, one element of which is a single crystal consisting essentialy of between 3 and 40 atomic percent antimony, remainder bismuth, said crystal being oriented so that the current flow is essentially along the trigonal crystal axis while maintaining the hot junction of the thermoelectric device at a temperature of less than 225° Kelvin.

References Cited in the file of this patent

UNITED STATES PATENTS

| | | |
|---|---|---|
| 2,685,608 | Justi | Aug. 3, 1954 |
| 2,734,344 | Lindenblad | Feb. 14, 1956 |
| 2,877,283 | Justi | Mar. 10, 1959 |
| 2,978,875 | Lackey et al. | Apr. 11, 1961 |

FOREIGN PATENTS

| | | |
|---|---|---|
| 807,619 | Great Britain | Jan. 30, 1957 |

OTHER REFERENCES

O'Brien et al.: Journal of Applied Physics, volume 27, No. 7, July 1956, pages 820–823.

Ioffe: "Semiconductor Thermoelements and Thermoelectric Cooling," Infosearch Limited, London, 1957, page 170.